United States Patent
Har et al.

(10) Patent No.: US 8,525,352 B2
(45) Date of Patent: Sep. 3, 2013

(54) SHORT AND LOW LOOP WIRE BONDING

(75) Inventors: Liew Siew Har, Ipoh (MY); Law Wai Ling, Ipoh (MY)

(73) Assignee: Carsem (M) sdn.bhd., Ipoh (MY)

( * ) Notice: Subject to any disclaimer, the term of this patent is extended or adjusted under 35 U.S.C. 154(b) by 0 days.

(21) Appl. No.: 13/228,319

(22) Filed: Sep. 8, 2011

(65) Prior Publication Data

US 2012/0256314 A1    Oct. 11, 2012

(30) Foreign Application Priority Data

Apr. 11, 2011 (MY) ............................. 2011001604

(51) Int. Cl.
 *H01L 21/44* (2006.01)
 *H01L 23/52* (2006.01)
 *H01L 23/48* (2006.01)
(52) U.S. Cl.
 USPC ............ 257/784; 257/786; 438/617; 438/613
(58) Field of Classification Search
 USPC ........................... 257/784, 786; 438/613, 617
 See application file for complete search history.

(56) References Cited

U.S. PATENT DOCUMENTS

| | | | | |
|---|---|---|---|---|
| 5,989,995 | A | * | 11/1999 | Nishiura et al. ............... 438/617 |
| 6,112,974 | A | * | 9/2000 | Nishiura et al. ............ 228/180.5 |
| 6,222,274 | B1 | | 4/2001 | Nishiura et al. |
| 6,380,634 | B1 | | 4/2002 | Umehara |
| 7,810,695 | B2 | | 10/2010 | Park et al. |
| 2003/0122265 | A1 | | 7/2003 | Baldonado et al. |
| 2004/0041008 | A1 | | 3/2004 | Mochida |
| 2006/0216863 | A1 | * | 9/2006 | Arakawa ....................... 438/118 |
| 2008/0099895 | A1 | | 5/2008 | Kwak |
| 2009/0189261 | A1 | | 7/2009 | Lim et al. |
| 2010/0090330 | A1 | | 4/2010 | Nakazato |
| 2010/0133677 | A1 | | 6/2010 | Murayama et al. |

* cited by examiner

*Primary Examiner* — Luan C Thai

(74) *Attorney, Agent, or Firm* — Kilpatrick Townsend & Stockton LLP

(57) ABSTRACT

A multi-die package includes a first semiconductor die and a second semiconductor die each having an upper surface with a plurality of bond pads disposed thereon. The upper surface of the second semiconductor die may be substantially coextensive with the upper surface of the first semiconductor die and extend substantially along a plane. The multi-die package also includes a plurality of bonding wires each coupling one of the bond pads on the upper surface of the first semiconductor die to a corresponding one of the bond pads on the upper surface of the second semiconductor die. A bonding wire of the plurality of bonding wires has a kink disposed at a height above the plane, a first hump disposed between the first semiconductor die and the kink, and a second hump disposed between the second semiconductor die and the kink.

19 Claims, 12 Drawing Sheets

SHORT AND LOW LOOP WIRE BONDING

CROSS-REFERENCE TO RELATED APPLICATIONS

The present application claims priority to Malaysian Patent Application No. PI 2011001604, filed Apr. 11, 2011, the entire contents of which are incorporated herein by reference for all purposes.

BACKGROUND

The present invention relates in general to semiconductor packaging and, more particularly, to wire bonding between contacts at substantially the same height or level in a semiconductor package.

An aspect of semiconductor packaging involves a wire bonding process. A conventional wire bonding process may use a conductive wire to connect a semiconductor die to a lead of a lead frame. This allows the semiconductor die to electrically communicate with external systems. The wire bonding process typically produces a loop in the conductive wire. A height of the loop determines an allowable thickness of a semiconductor package.

Semiconductor packages are continually being designed to be more compact. This can be accomplished by using multi dice packages, reducing thickness of the packages, and/or minimizing size of the packages. Loop height impacts each of these options.

Conventional methods of reducing loop height between contacts at different levels may include pulling the bonding wire downward. This increases stress in the bonding wire, however, and can lead to fracturing or cracking near ball bonds. Other methods include forming a folded loop in the bonding wire or forming a depression on the neck portion of the bonding wire. Quality of these methods is difficult to asses, however, and they generally reduce wire strength. One method that has been used with some success includes forming a first ball bond on a higher contact, then attaching a bonding wire to a lower contact using a ball bond, and then attaching the bonding wire to the higher contact using a stitch bond.

For contacts at the same height or level, the loop height is typically reduced by pulling the bonding wire downward. As explained above, however, this increases stress in the bonding wire and can lead to fracturing or cracking near ball bonds. The stress can be reduced by separating the contacts farther apart and lengthening the bonding wire. However, this increases lateral dimensions and size of the package. Other methods that have been used to reduce loop height when connecting contacts at different levels fail to provide the same benefit when used with contacts at the same height or level.

Thus, there is a need to reduce loop height in bonding wires used to connect contacts at the same height or level without increasing wire length.

SUMMARY

Embodiments of the present invention provide short and low loop wire bonding between contacts at substantially the same height in a semiconductor package. In accordance with an embodiment, for example, a multi-die package includes a die pad and a first semiconductor die disposed on the die pad. The first semiconductor die may include an upper surface having a first plurality of bond pads thereon. The multi-die package also includes a second semiconductor die disposed on the die pad. The second semiconductor die may include an upper surface having a second plurality of bond pads thereon. The upper surface of the second semiconductor die may be substantially coextensive with the upper surface of the first semiconductor die and extend substantially along a plane. The multi-die package also includes a plurality of bonding wires each coupling one of the first plurality of bond pads on the upper surface of the first semiconductor die to a corresponding one of the second plurality of bond pads on the upper surface of the second semiconductor die. A bonding wire of the plurality of bonding wires may have a kink disposed at a height above the plane, a first hump disposed between the first semiconductor die and the kink, and a second hump disposed between the second semiconductor die and the kink. A first height of the first hump and a second height of the second hump may each be being greater than the height of the kink above the plane.

In accordance with another embodiment, a semiconductor package includes a first bond pad disposed on a first upper surface and a second bond pad disposed on a second upper surface. The first upper surface may be laterally spaced from and substantially coextensive with the second upper surface. The semiconductor package also includes a bonding wire having a first end and a second end. The first end of the bonding wire may be coupled to the first bond pad, and the second end of the bonding wire may be coupled to the second bond pad. The bonding wire includes a first length extending upward from the second bond pad to a first hump, and a second length coupled to the first length at the first hump. The second length extends downward from the first hump to a kink. The kink is disposed above the first upper surface and the second upper surface. The bonding wire also includes a third length coupled to the second length at the kink. The third length extends upward from the kink to a second hump. The bonding wire also includes a fourth length coupled to the third length at the second hump. The fourth length extends downward from the second hump to the first bond pad.

In accordance with yet another embodiment, a method of coupling a first end of a bonding wire to a first bond pad and a second end of the bonding wire to a second bond pad includes forming a ball bond on the second bond pad using a portion of the bonding wire. The method also includes forming a first length of the bonding wire, where the first length is coupled to the ball bond and extends upward to a first hump in the bonding wire. The method also includes forming a second length of the bonding wire coupled to the first length at the first hump. The second length extends downward from the first hump to a kink in the bonding wire. The kink is disposed at a height above the upper surface of the first bond pad and the upper surface of the second bond pad. The method also includes forming a third length of the bonding wire coupled to the second length at the kink. The third length extends upward from the kink to a second hump in the bonding wire. The method also includes forming a fourth length of the bonding wire coupled to the third length at the second hump. The fourth length extends downward from the second hump to a first ball bond disposed on the first bond pad. The method also includes coupling the fourth length to the first ball bond.

Numerous benefits are achieved using embodiments of the present invention over conventional wire bonding techniques. In one embodiment, for example, a bonding wire formed between two contacts that are at the same height or level includes humps on each side of a kink. This reduces loop height and allows a thickness of the semiconductor package to be reduced. This also reduces stress in the bonding wire. Depending on the embodiment, one or more of these benefits may exist. These and other benefits are described more fully below.

DETAILED DESCRIPTION

Embodiment of the present invention provide wire bonding between contacts that are at substantially the same height or level in a semiconductor package. One or both of the contacts may be a bond pad on semiconductor die, a bond pad on a substrate, a lead of a leadframe, or the like. In one embodiment, for example, the bonding wire connects a bond pad on a first semiconductor die with a bond pad on a second semiconductor die. The bonding wire may include humps on each side of a kink, where the kink is lower than the humps but higher than the surfaces being bonded. Such a bonding wire can provide lower loop height, shorter wire length, and reduced stress compared to conventional methods.

Figure 1:
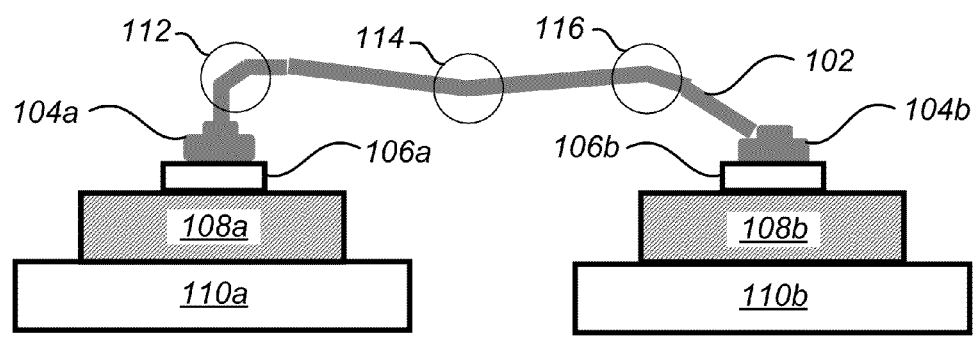
FIG. 1 is a simplified diagram of a bonding wire electrically connecting two surfaces that are at the same level in accordance with an embodiment of the invention.

FIG. 1 is a simplified diagram of a bonding wire electrically connecting two surfaces that are at the same height or level in accordance with an embodiment of the invention. The arrangement shown in FIG. 1 may exist in an assembled semiconductor package that may also include an encapsulant material (not shown), or the arrangement may exist during a stage of assembly of a semiconductor package. The surfaces in this example may be upper surfaces of bond pads 106a, 106b and/or upper surfaces of semiconductor dice 108a, 108b. Note that the relative sizes and shapes of the bond pads 106a, 106b, semiconductor dice 108a, 108b, and die pads 110a, 110b are exaggerated for purposes of illustration. Also, the bond pads 106a, 106b may not protrude above the upper surfaces of the semiconductor dice 108a, 108b as illustrated in the examples provided in this application.

As shown in FIG. 1, a bonding wire 102 extends between ball bonds 104a, 104b. The ball bonds 104a, 104b are bonded to respective bond pads 106a, 106b of semiconductor dice 108a, 108b, and the semiconductor dice 108a, 108b are disposed on respective die pads 110a, 110b. As will be explained more fully below, the bonding wire 102 may be bonded to bond pad 106a using ball stitch bonding, and the bonding wire 102 may be bonded to bond pad 106b using ball stitch on ball (or wedge) bonding. In this example, the bonding wire 102 includes humps 112, 116 and kink 114. The kink 114 is disposed at a height above the upper surfaces of the bond pads 106a, 106b and the upper surfaces of the semiconductor dice 108a, 108b, but below a maximum height of the humps 112, 116.

As used herein, a hump generally refers to a kink having portions that extend downward on each side (e.g., concave down). An inflection point of the hump is at a greater distance from a surface of the contact than portions of the wire on either side of the hump.

The shape of the bonding wire 102 reduces loop height by moving a maximum height from a single point in the bonding wire 102 to one of the humps 112, 116. Generally a height of hump 112 above an upper surface of bond pad 106a will be slightly greater than a height of hump 116 above an upper surface of bond pad 106b. The shape of the bonding wire 102 also reduces stress by limiting the downward pull at the ball bonds 104a, 104b. The reduction in height and stress are achieved without increasing bonding wire length like conventional techniques.

The bonding wire 102 may comprise a number of conductive elements. As an example, in some embodiments the bonding wire 102 includes at least one of gold or copper. The bonding wire 102 may also be of any typical diameter. As an example, in some embodiments the bonding wire has a diameter of about 20 μm.

As would be appreciated by one of ordinary skill in the art, a semiconductor die may include a plurality of bond pads, and each bond pad may be electrically coupled to a corresponding bond pad of another semiconductor die or to a corresponding lead of a leadframe using a bonding wire. Thus, a typically semiconductor package may include a plurality of bonding wires similar to the bonding wire 102 illustrated in FIG. 1.

Figure 2:
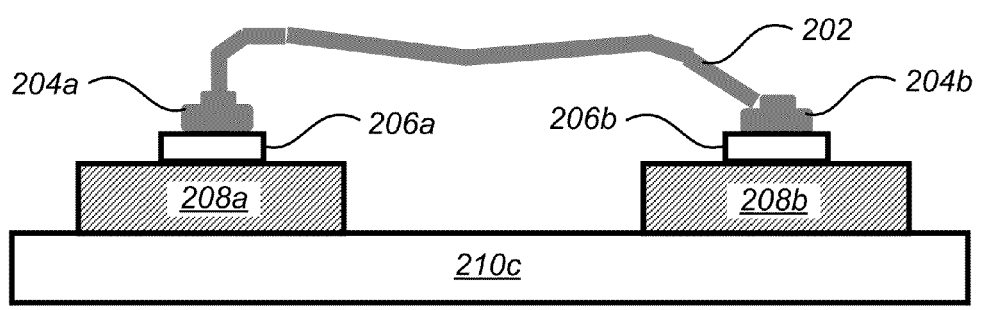
FIG. 2 is a simplified diagram of a bonding wire electrically connecting two surfaces that are at the same level in accordance with another embodiment of the invention.

FIG. 2 is a simplified diagram of a bonding wire electrically connecting two surfaces that are at the same height or level in accordance with another embodiment of the invention. In this example, bonding wire 202 extends between a ball bonds 204a, 204b and connects bond pads 206a, 206b, and semiconductor dice 208a, 208b are disposed on a single die pad 210c. As can be seen in FIG. 2, the bonding wire 202 has a similar shape to the bonding wire 102 in FIG. 1. The bonding wire 202 includes humps on each side of a kink, where the kink is disposed at a height above upper surfaces of the bond pads 206a, 206b and the semiconductor dice 208a, 208b but below a maximum height of the humps.

Figure 3:
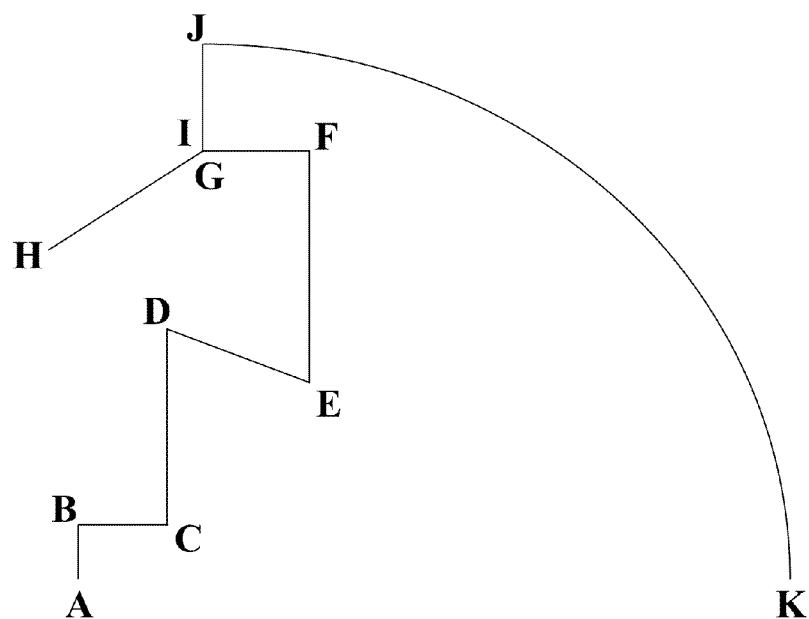
FIG. 3 is a simplified diagram illustrating a path followed by a capillary during formation of a bonding wire in accordance with an embodiment of the invention.
Figure 4:
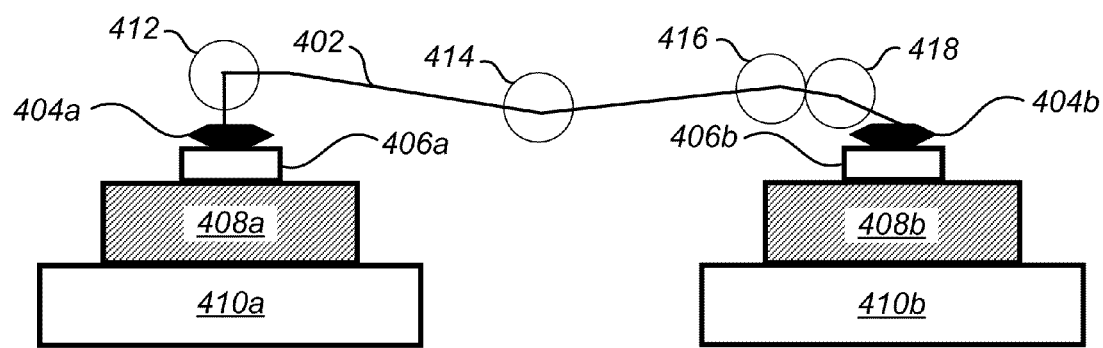
FIG. 4 is a simplified diagram of a bonding wire in accordance with an embodiment of the invention.

FIG. 3 is a simplified diagram illustrating a path followed by a capillary during formation of a bonding wire in accordance with an embodiment of the invention. The path may be used to produce a bonding wire having a shape similar to that shown in FIG. 4. Bonding wire 402 in FIG. 4 extends between ball bonds 404a, 404b and electrically connects bond pads 406a, 406b of semiconductor dice 408a, 408b. The semiconductor dice 408a, 408b are disposed on respective die pads 410a, 410b.

In this example, the bonding wire 402 includes humps 412, 416 and kinks 414, 418. The kink 418 separates the portion of the bonding wire 402 between hump 416 and ball bond 404b into an upper portion and a lower portion. The upper portion extends between the kink 418 and the hump 416. The lower portion extends between the kink 418 and the ball bond 404b. The lower portion extends more vertically upward away from an upper surface of the semiconductor die 408b than the upper portion. This provides additional clearance between the upper surface of the semiconductor die 408b and the bonding wire 402.

FIGS. 5A-5L are simplified diagrams illustrating various positions of a capillary and various shapes of a wire during formation of a bonding wire in accordance with an embodiment of the invention. Each of the points A-K shown in the path illustrated in FIG. 3 are explained with reference to FIGS. 5A-5L. As shown in this example, the bonding wire is formed between contacts 506a, 506b. The contacts 506a, 506b may be bond pads of semiconductor dice 508a, 508b disposed on die pads 510a, 510b respectively. Upper surfaces of the contacts 506a, 506b are at substantially the same height or level and are thus substantially coextensive. Upper surfaces of the semiconductor dice 508a, 508b are also at substantially the same height or level and are thus substantially coextensive.

Figure 5A:
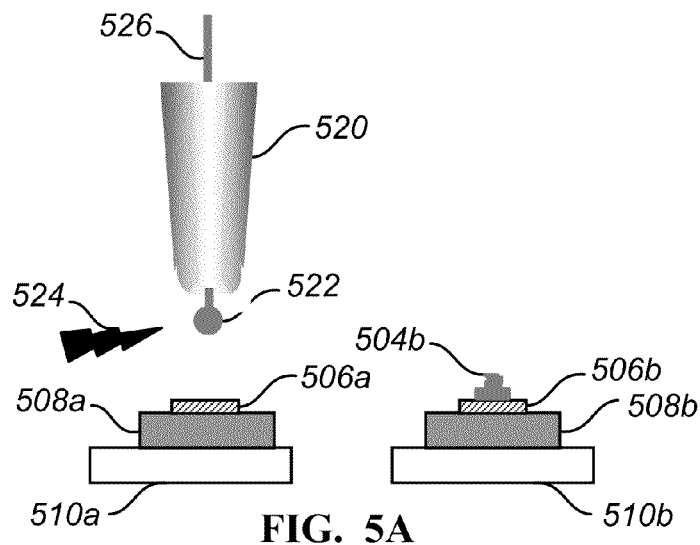
FIGS. 5A-5L are simplified diagrams illustrating various positions of a capillary and various shapes of a wire during formation of a bonding wire in accordance with an embodiment of the invention.

As shown in FIG. 5A, a ball bond 504b may be formed on contact 506b. Details of an exemplary method for forming the ball bond 504b are provided below with reference to FIGS. 6 and 7A-7H. FIG. 5A also shows a wire 526 extending through a capillary 520. The capillary 520 may be part of a larger bonding tool that is not shown for simplicity. A tail of the wire 526 extending below the capillary 520 is heated and melted using an electric spark 524 in accordance with known techniques. The electric spark 524 is generally referred to as an electric flame off (EFO) and may be generated using an EFO wand (not shown). The EFO melts an end of the wire 526 to form a free air ball (FAB) 522.

Figure 5B:
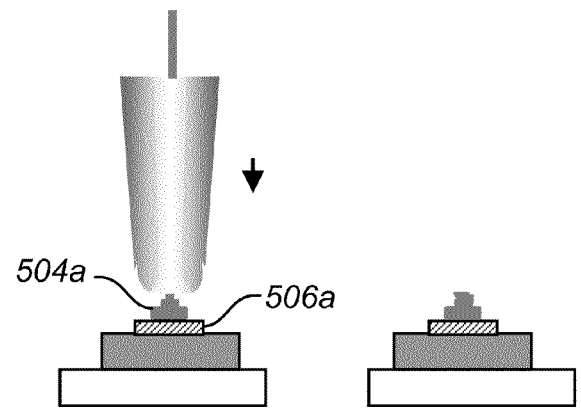

In FIG. 5B, the capillary 520 is moved downward until the FAB 522 comes into contact with the bond pad 506a. Ultrasonic energy and force may be applied in accordance with known techniques to form ball bond 504a on contact 506a.

Figure 5C:
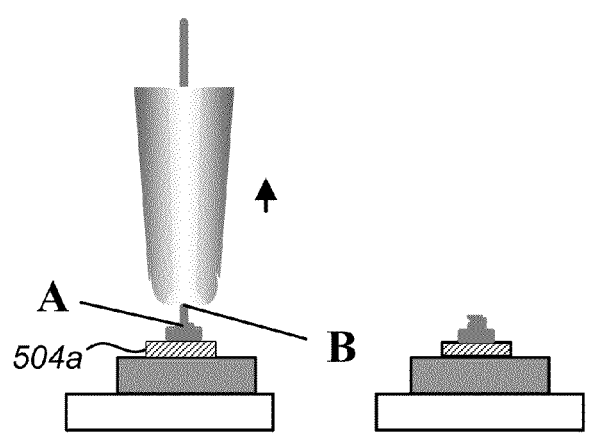

In FIG. 5C, a clamp opens and the capillary 520 is raised substantially vertically upward a first distance from the ball bond 504a. The capillary 520 is raised from point A to point B (see FIG. 3).

Figure 5D:
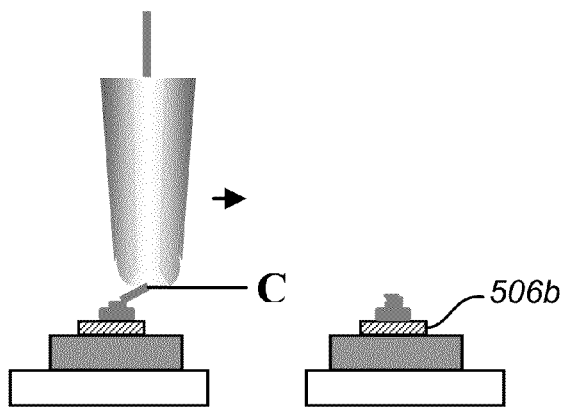

In FIG. 5D, the capillary 520 is moved laterally a second distance in a direction towards the contact 506b. The capillary 520 is moved from point B to point C (see FIG. 3).

Figure 5E:
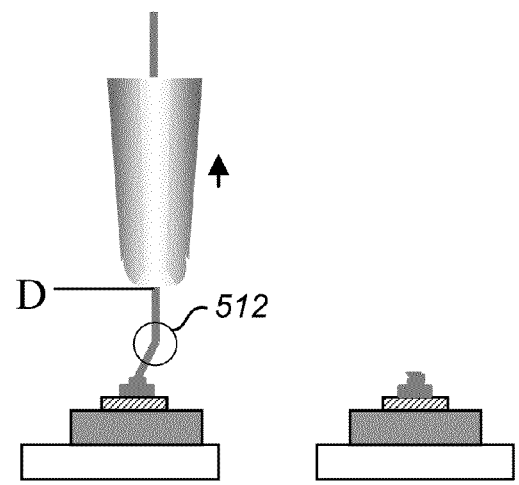

In FIG. 5E, the capillary 520 is raised substantially vertically upward a third distance. The capillary 520 is moved from point C to point D (see FIG. 3). As shown in FIG. 5E, a kink (or hump) 512 is formed in the wire 526.

Figure 5F:
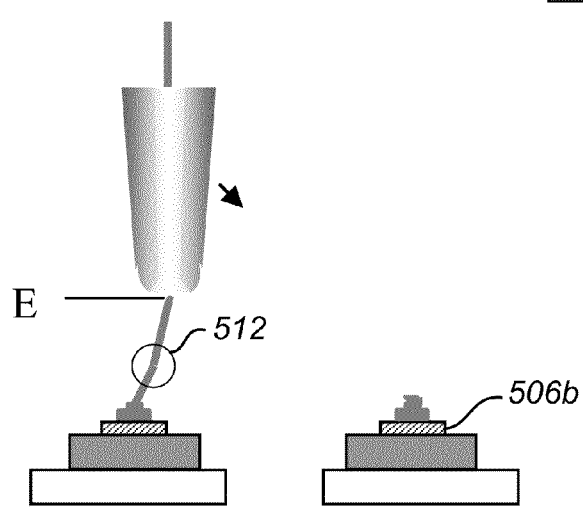

In FIG. 5F, the capillary 520 is moved laterally and downward a fourth distance in a direction towards the contact 506b. The capillary is moved from point D to point E (see FIG. 3).

Figure 5G:
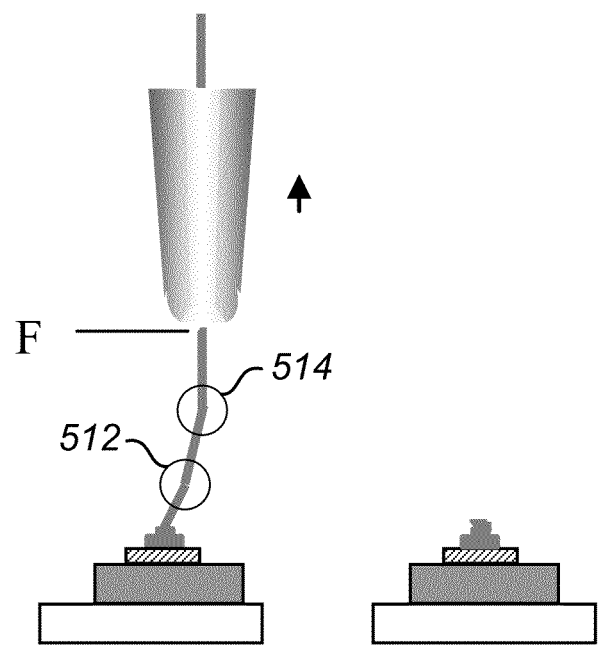

In FIG. 5G, the capillary 520 is raised substantially vertically upward a fifth distance. The capillary 520 is moved from point E to point F (see FIG. 3). As shown in FIG. 5G, a kink 514 is formed in the wire 526.

Figure 5H:
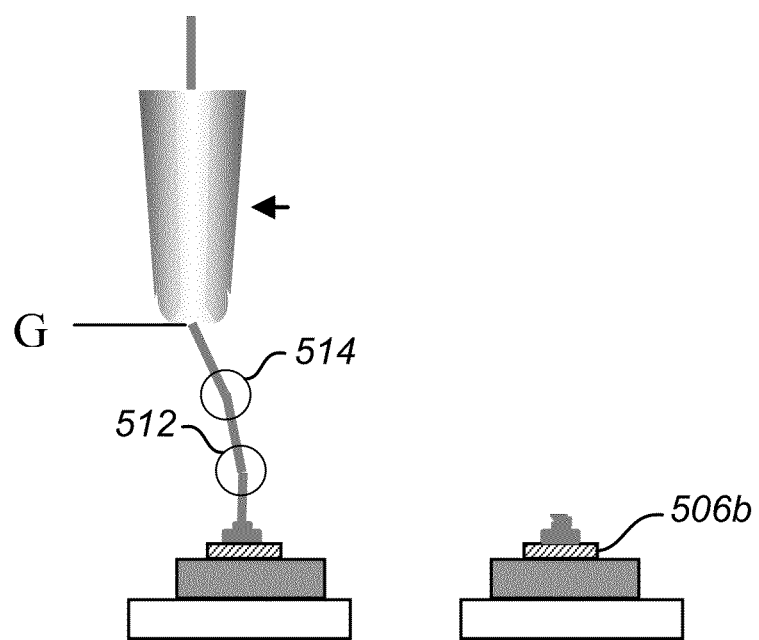

In FIG. 5H, the capillary 520 is moved laterally a sixth distance in a direction away from the contact 506b. The capillary 520 is moved from point F to point G (see FIG. 3).

Figure 5I:
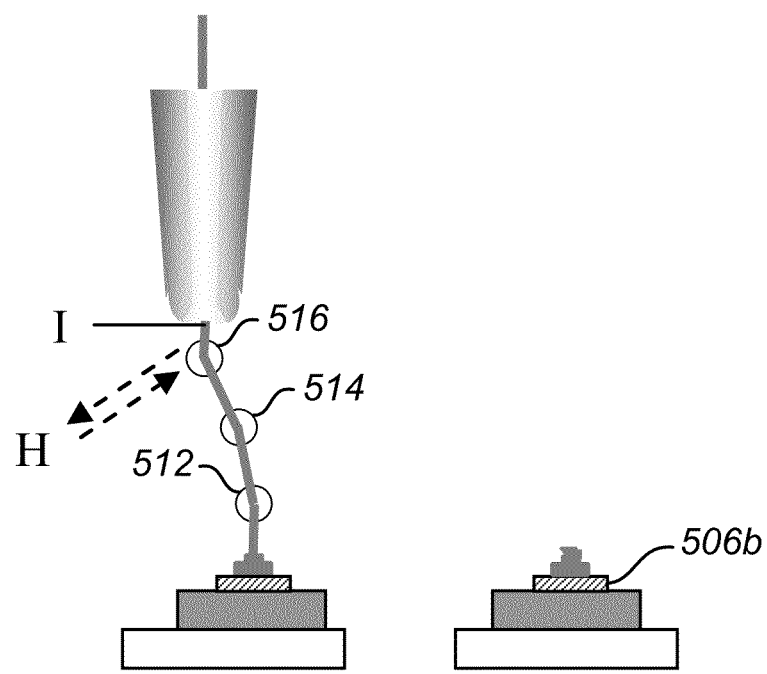

In FIG. 5I, the capillary 520 is first moved laterally and downward a seventh distance in a direction away from the contact 506b. The capillary 520 is then moved laterally and upward an eighth distance in a direction towards the contact 506b. This moves the capillary 520 from point G to point H and from point H to point I (see FIG. 3). In an embodiment, point I is at substantially the same position as point G, and the seventh distance is approximately the same as the eighth distance. As shown in FIG. 5I, a kink (or hump) 516 is formed in the wire 526.

Figure 5J:
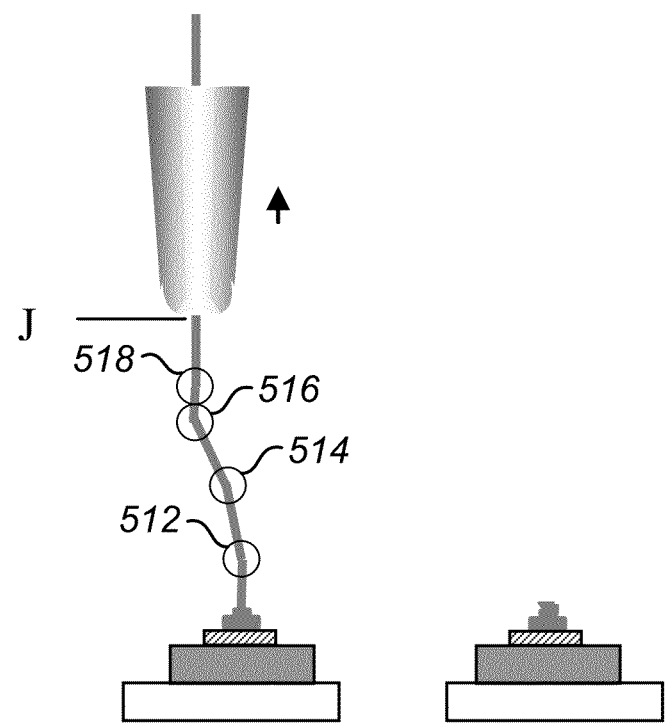

In FIG. 5J, the capillary 520 is raised substantially vertically upward a ninth distance. The capillary 520 is moved from point I to point J (see FIG. 3). As shown in FIG. 5G, a kink 518 is formed in the wire 526.

Figure 5K:
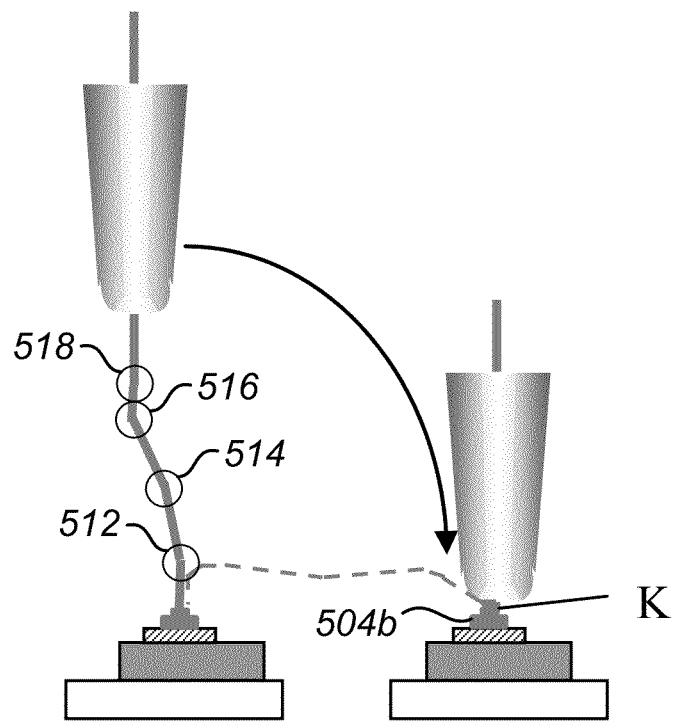

In FIG. 5K, the capillary 520 is moved downward to a position near the contact 506b. The capillary 520 is moved from point J to point K (see FIG. 3). The clamp within the capillary 520 may close before moving from point J to point K. At point K, the wire 526 may be connected to the ball bond 504b using ball stitch on ball (or wedge) bonding.

Figure 5L:
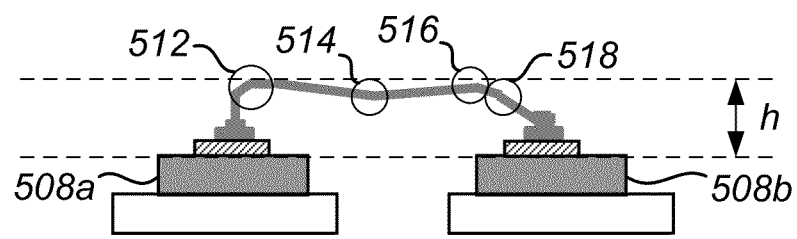

FIG. 5L shows the bonding wire formed in the steps illustrated in FIGS. 5A-5K. The bonding wire includes humps 512, 516 and kinks 514, 518. Using these steps, the bonding wire may be formed to have a maximum height (h) of no more than about 55 μm above an upper surface of the contacts 506a, 506b (or a maximum h of no more than about 55 μm above an upper surface of the semiconductor dice 508a, 508b if the contacts 506a, 506b and the semiconductor dice 508a, 508b are at approximately the same level). This compares to a loop height of about 150-200 μm using conventional processes.

Figure 6:
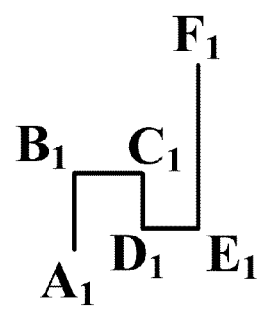
FIG. 6 is a simplified diagram illustrating a path followed by a capillary during formation of a ball bond in accordance with an embodiment of the invention.

FIG. 6 is a simplified diagram illustrating a path followed by a capillary during formation of a ball bond in accordance with an embodiment of the invention. The path may be used to produce a ball bond similar to the ball bond 504b shown in FIG. 5A. FIGS. 7A-7H are simplified diagrams illustrating various positions of a capillary during formation of an ball bond in accordance with an embodiment of the invention. Each of the points $A_1$-$F_1$ shown in the path illustrated in FIG. 6 are explained with reference to FIGS. 7A-7H.

Figure 7A:
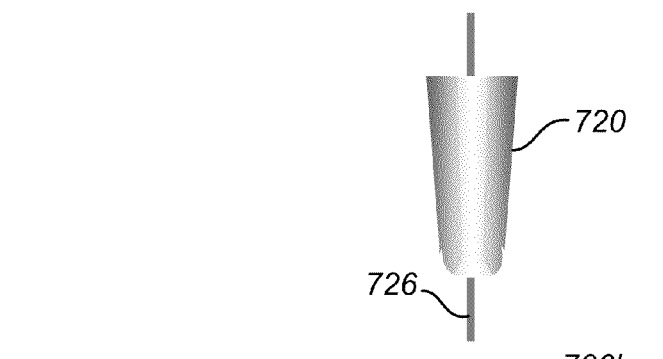
FIGS. 7A-7H are simplified diagrams illustrating various positions of a capillary during formation of a ball bond in accordance with an embodiment of the invention.

FIG. 7A shows a wire 726 extending through a capillary 720. FIG. 7A also shows contacts 706a, 706b. The contacts 706a, 706b may be bond pads of semiconductor dice 708a, 708b disposed on die pads 710a, 710b respectively.

Figure 7B:
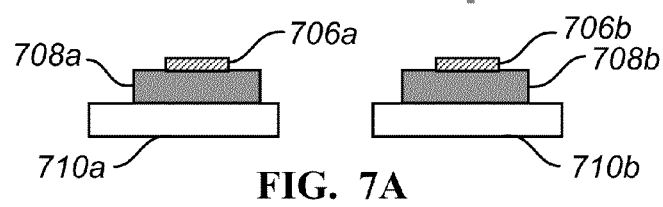
Figure 7B:
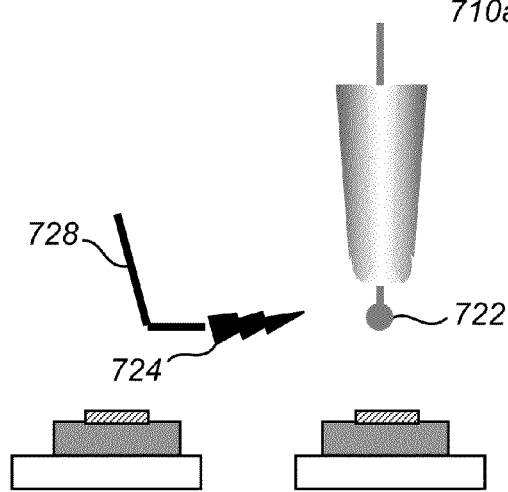

In FIG. 7B, a tail of the wire 726 extending below the capillary 720 is heated and melted using an EFO 724 in accordance with known techniques. The EFO 724 may be generated using EFO wand 728. The EFO melts an end of the wire 726 to form a free air ball 722.

Figure 7C:
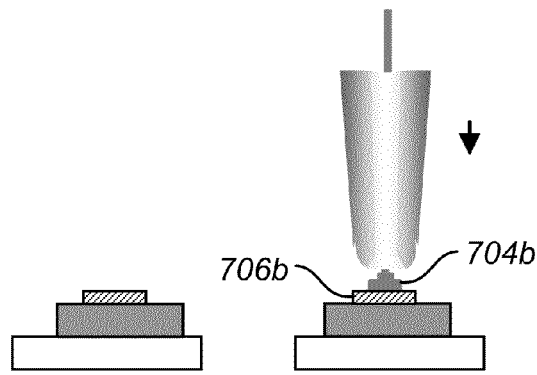

In FIG. 7C, the capillary 720 is moved downward until the FAB 722 comes into contact with the bond pad 706b. Ultrasonic energy and force may be applied in accordance with known techniques to form ball bond 704b on contact 706b.

Figure 7D:
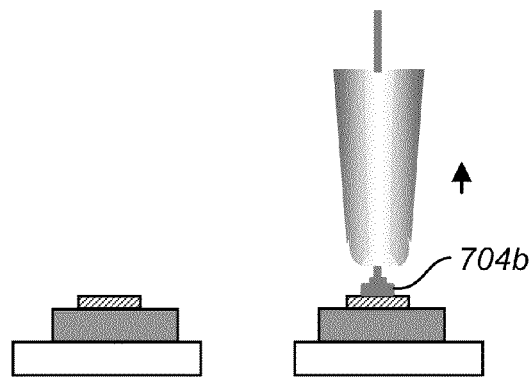

In FIG. 7D, a clamp opens and the capillary 720 is raised substantially vertically upward a first distance. The capillary 720 is raised from point $A_1$ to point $B_1$ (see FIG. 6). The first distance provides sufficient clearance for subsequent movement of the capillary 720.

Figure 7E:
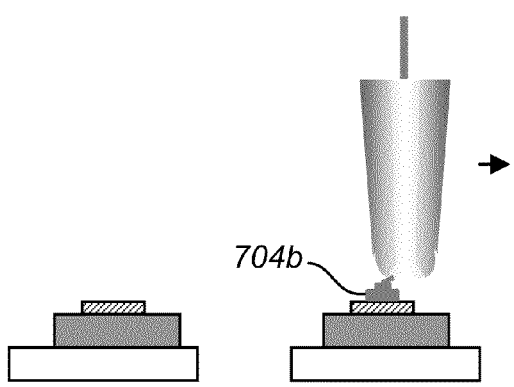

In FIG. 7E, the capillary 720 is moved laterally a second distance to offset from the ball bond 704b. The capillary 720 is moved from point $B_1$ to point $C_1$ (see FIG. 6).

Figure 7F:
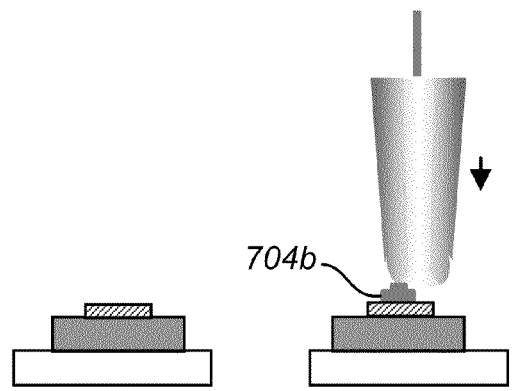

In FIG. 7F, the capillary 720 is moved downward a third distance. The capillary 720 is moved from point $C_1$ to point $D_1$ (see FIG. 6). A stitch bond if formed on top of the ball bond 704b.

Figure 7G:
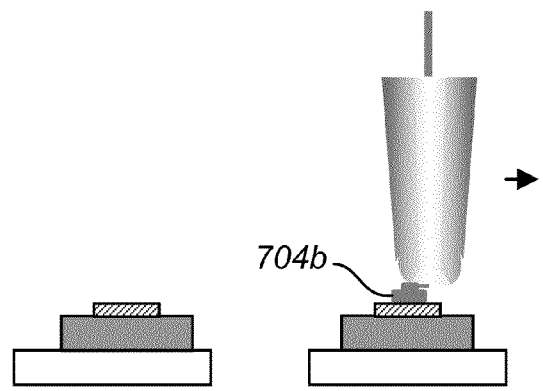

In FIG. 7G, the capillary 720 is moved laterally a fourth distance. The capillary 720 is moved from point $D_1$ to point $E_1$ (see FIG. 6). The wire 726 at a neck of the ball bond 704b may be weakened as the capillary 720 moves from point $B_1$ to point $C_1$ and from point $C_1$ to point $D_1$.

Figure 7H:
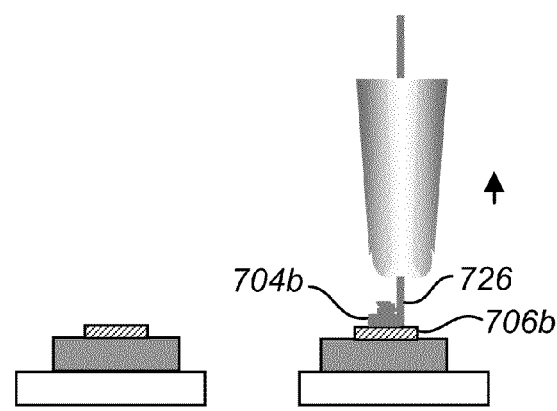

In FIG. 7H, the capillary 720 is moved raised substantially vertically upward a fifth distance. The capillary 720 is moved from point $E_1$ to point $F_1$ (see FIG. 6). The clamp within the capillary 720 may close, and the wire 726 may be torn from the ball bond 704b leaving the ball bond 704b on the contact 706b.

Figure 8:
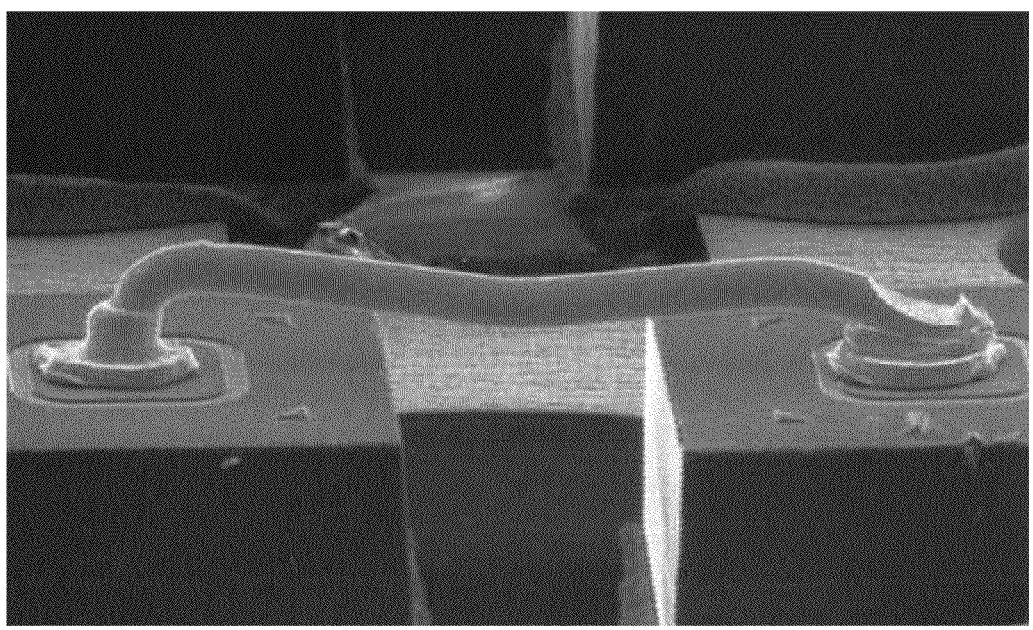
FIG. 8 is a magnified image of an exemplary bonding wire in accordance with an embodiment of the invention.

FIG. 8 is a magnified image of an exemplary bonding wire in accordance with an embodiment of the invention. The bonding wire illustrated in this figure may be formed using the steps illustrate in FIGS. 5A-5L. The ball bond illustrated in this figure on the right contact may be formed using the steps illustrated in FIGS. 7A-7H. The bonding wire includes a kink near a center of the wire and a hump on each side of the kink. As can be seen, a maximum height of the bonding wire above an upper surface of the contacts is at the humps, with the hump on the left being slightly higher than the hump on the left. The kink is disposed at a height above the upper surface of the contacts but lower than either of the humps. The bonding wire is connected to the ball bond disposed on the right contact using ball stitch on ball (or wedge) bonding.

Figure 9:
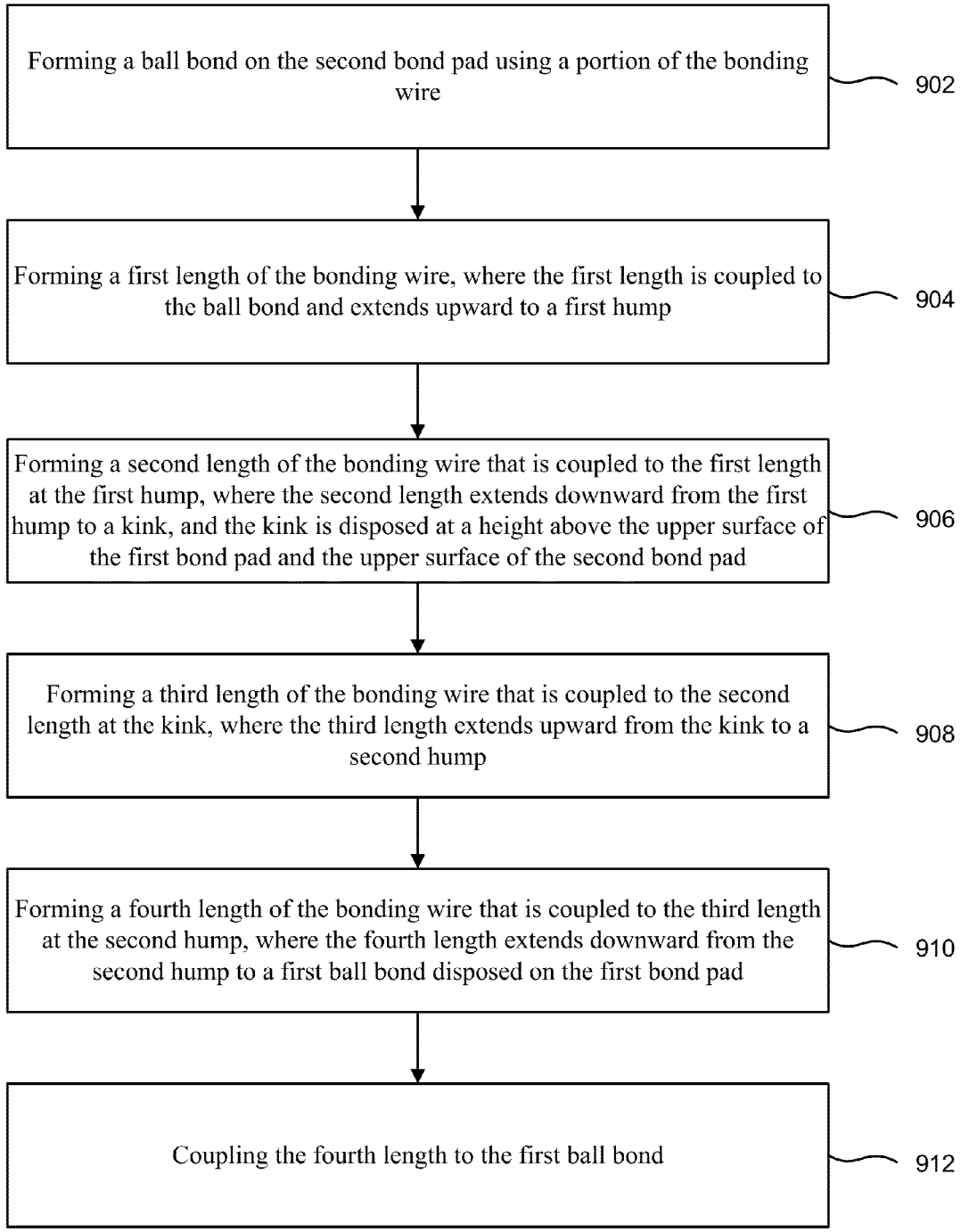
FIG. 9 is a simplified flowchart illustrating an exemplary method of coupling a first end of a bonding wire to a first bond pad and a second end of the bonding wire to a second bond pad in accordance with an embodiment of the invention.

FIG. 9 is a simplified flowchart illustrating an exemplary method of coupling a first end of a bonding wire to a first bond pad and a second end of the bonding wire to a second bond pad in accordance with an embodiment of the invention. An upper surface of the first bond pad may be substantially coextensive with an upper surface of the second bond pad. The method includes forming a ball bond a the second bond pad using a portion of the bonding wire (902). In an embodiment, a first ball bond is formed on the first bond pad prior to forming the ball bond on the second bond pad.

The method also includes forming a first length of the bonding wire, where the first length is coupled to the ball bond and extends upward to a first hump in the bonding wire (904). The method also includes forming a second length of the bonding wire that is coupled to the first length at the first hump, where the second length extends downward from the first hump to a kink in the bonding wire, and the kink is disposed at a height above the upper surface of the first bond pad and the upper surface of the second bond pad (906). The method also includes forming a third length of the bonding wire that is coupled to the second length at the kink, where the third length extends upward from the kink to a second hump in the bonding wire (908).

The method also include forming a fourth length of the bonding wire that is coupled to the third length at the second hump, where the fourth length extends downward from the second hump to a first ball bond disposed on the first bond pad (910). In an embodiment, the fourth length may include an upper portion and a lower portion coupled at a second kink, the upper portion coupled to the third length at the second hump, and the lower portion coupled to the first ball bond. The lower portion may extend more vertically upward away from the first upper surface than the upper portion.

The method also includes coupling the fourth length to the first ball bond (912). In an embodiment, the fourth length is coupled to the first ball bond using ball stitch on ball (or wedge) bonding.

It should be appreciated that the specific steps illustrated in FIG. 9 provide a particular method of coupling a first end of a bonding wire to a first bond pad and a second end of the bonding wire to a second bond pad in accordance with an embodiment of the present invention. The steps outlined above may be continuously repeated by system software. Other sequences of steps may also be performed according to alternative embodiments. For example, the steps outlined above may be performed in a different order. Moreover, the individual steps illustrated in FIG. 9 may include multiple sub-steps that may be performed in various sequences as appropriate to the individual step. Furthermore, additional steps may be added or removed depending on the particular application.

It should be noted that some embodiments of the present invention may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may be adapted to perform the necessary tasks. The term "computer-readable medium" includes, but is not limited to, portable or fixed storage devices, optical storage devices, sim cards, other smart cards, and various other mediums capable of storing, containing, or carrying instructions or data.

While the present invention has been described in terms of specific embodiments, it should be apparent to those skilled in the art that the scope of the present invention is not limited to the embodiments described herein. For example, features of one or more embodiments of the invention may be combined with one or more features of other embodiments without departing from the scope of the invention. The specification and drawings are, accordingly, to be regarded in an illustrative rather than a restrictive sense. Thus, the scope of the present invention should be determined not with reference to the above description, but should be determined with reference to the appended claims along with their full scope of equivalents.

What is claimed is:

1. A multi-die package comprising:

at least one die pad;

a first semiconductor die disposed on the least one die pad, the first semiconductor die including an upper surface having a first plurality of bond pads thereon;

a second semiconductor die disposed on the least one die pad, the second semiconductor die including an upper surface having a second plurality of bond pads thereon, the upper surface of the first semiconductor die and the upper surface of the second semiconductor die being at substantially a same height and extending substantially along a plane; and a plurality of bonding wires each coupling one of the first plurality of bond pads on the upper surface of the first semiconductor die to a corresponding one of the second plurality of bond pads on the upper surface of the second semiconductor die, a bonding wire of the plurality of bonding wires having a kink disposed at a height above the plane, the bonding wire having a first hump disposed between the first semiconductor die and the kink, and a second hump disposed between the second semiconductor die and the kink, a first height of the first hump and a second height of the second hump each being greater than the height of the kink above the plane, each bonding wire comprising:

a first length extending upward from a bond pad of the second plurality of bond pads on the upper surface of the second semiconductor die to the first hump;

a second length coupled to the first length at the first hump, the second length extending downward from the first hump to the kink, the kink disposed at a height above the upper surface of the first semiconductor die and the upper surface of the second semiconductor die;

a third length coupled to the second length at the kink, the third length extending upward from the kink to the second hump; and a fourth length coupled to the third length at the second hump, the fourth length extending from the second hump to a bond pad of the first plurality of bond pads on the upper surface of the first semiconductor die, wherein the fourth length comprises an upper portion and a lower portion coupled at a second kink spaced from the second hump, the upper portion coupled to the third length at the second hump and extending to the second kink, and the lower portion extending from the second kink to the bond pad of the first plurality of bond pads on the upper surface of the first semiconductor die, the lower portion extending more vertically upward from the upper surface of the first semiconductor die than the upper portion, and the upper portion extending more laterally parallel to the upper surface of the first semiconductor die than the lower portion.

2. The multi-die package of claim 1 wherein a maximum height of the bonding wire above the plane is at the first hump and is no more than about 55 µm.

3. The multi-die package of claim 1 wherein a maximum height of the bonding wire above the plane is at the second hump and is no more than about 55 µm.

4. The multi-die package of claim 1 wherein the least one die pad comprises a first die pad and a second die pad, the first die pad laterally spaced from the second die pad, the first semiconductor die disposed on the first die pad and the second semiconductor die disposed on the second die pad.

5. The multi-die package of claim 1 wherein a first end of the bonding wire is bonded to a first ball bond disposed on the bond pad of the first plurality of bond pads on the upper surface of the first semiconductor die using a wedge bond.

6. The multi-die package of claim 5 wherein a second end of the bonding wire is bonded to the bond pad of the second plurality of bond pads on the upper surface of the second semiconductor die using a second ball bond.

7. A semiconductor package comprising:
a first bond pad disposed on a first upper surface;
a second bond pad disposed on a second upper surface, the first upper surface being laterally spaced from the second upper surface; and
a bonding wire having a first end and a second end, the first end of the bonding wire coupled to the first bond pad, and the second end of the bonding wire coupled to the second bond pad, the bonding wire comprising:
a first length extending upward from the second bond pad to a first hump;
a second length coupled to the first length at the first hump, the second length extending downward from the first hump to a kink, the kink disposed at a height above the first upper surface and the second upper surface;
a third length coupled to the second length at the kink, the third length extending upward from the kink to a second hump; and
a fourth length coupled to the third length at the second hump, the fourth length extending from the second hump to the first bond pad, wherein the fourth length comprises an upper portion and a lower portion coupled at a second kink spaced from the second hump, the upper portion coupled to the third length at the second hump and extending to the second kink, and the lower portion extending from the second kink to the first bond pad, the lower portion extending more vertically upward from the first upper surface than the upper portion, and the upper portion extending more laterally parallel to the first upper surface than the lower portion.

8. The semiconductor package of claim 7 wherein a maximum height of the bonding wire above the first upper surface and the second upper surface is at the first hump and is no more than about 55 µm.

9. The semiconductor package of claim 7 wherein a maximum height of the bonding wire above the first upper surface and the second upper surface is at the second hump and is no more than about 55 µm.

10. The semiconductor package of claim 7 wherein the first length is coupled to the second bond pad using a ball bond.

11. The semiconductor package of claim 7 wherein the fourth length is coupled to a ball bond disposed on the first bond pad using a wedge bond.

12. The semiconductor package of claim 7 wherein a diameter of the bonding wire is about 20 µm and the bonding wire comprises at least one of gold or copper.

13. A method of coupling a first end of a bonding wire to a first bond pad on a first semiconductor die and a second end of the bonding wire to a second bond pad on a second semiconductor die, the method comprising:
forming a ball bond on the second bond pad using a portion of the bonding wire;
forming a first length of the bonding wire, the first length coupled to the ball bond and extending upward to a first hump in the bonding wire;
forming a second length of the bonding wire coupled to the first length at the first hump, the second length extending downward from the first hump to a kink in the bonding wire, the kink disposed at a height above an upper surface of the first bond pad and an upper surface of the second bond pad;
forming a third length of the bonding wire coupled to the second length at the kink, the third length extending upward from the kink to a second hump in the bonding wire;
forming a fourth length of the bonding wire coupled to the third length at the second hump, the fourth length extending from the second hump to a first ball bond disposed on the first bond pad, wherein the fourth length comprises an upper portion and a lower portion coupled at a second kink spaced from the second hump, the upper portion coupled to the third length at the second hump and extending to the second kink, and the lower portion extending from the second kink to the first ball bond, the lower portion extending more vertically upward from the first bond pad than the upper portion, and the upper portion extending more laterally parallel to the first bond pad than the lower portion; and
coupling the fourth length to the first ball bond.

14. The method of claim 13 further comprising:
prior to forming the ball bond on the second bond pad, forming the first ball bond on the first bond pad; and
tearing the bonding wire to separate the bonding wire from the first ball bond.

15. A wire bonding method in which a wire passing through a capillary is coupled to a first bond pad and to a second bond pad, the method comprising the steps of:
forming a ball bond on the second bond pad;
thereafter, while paying out a length of the wire:
raising the capillary substantially vertically upward a first distance from the ball bond;
thereafter, moving the capillary laterally a second distance in a direction towards the first bond pad;
thereafter, raising the capillary substantially vertically upward a third distance;
thereafter, moving the capillary laterally and downward a fourth distance in a direction towards the first bond pad;
thereafter, raising the capillary substantially vertically upward a fifth distance;
thereafter, moving the capillary laterally a sixth distance in a direction away from the first bond pad;
thereafter, moving the capillary laterally and downward a seventh distance in a direction away from the first bond pad;
thereafter, moving the capillary laterally and upward an eighth distance in a direction towards the first bond pad;
thereafter, raising the capillary substantially vertically upward a ninth distance;
thereafter, moving the capillary arcuately downward in a direction towards the first bond pad; and
thereafter, coupling the wire to the first bond pad.

16. The wire bonding method of claim 15 wherein the seventh distance is approximately the same as the eighth distance.

17. The wire bonding method of claim 15 wherein forming the ball bond comprises melting an end of the wire using an electric flame off to form a free air ball.

18. The wire bonding method of claim 15 further comprising:
   prior to forming the ball bond on the second bond pad, forming a first ball bond on the first bond pad; and
   tearing the wire to separate the wire from the first ball bond on the first bond pad.

19. The wire bonding method of claim 18 wherein coupling the wire to the first bond pad comprises forming a wedge bond on the first ball bond.

* * * * *

UNITED STATES PATENT AND TRADEMARK OFFICE
CERTIFICATE OF CORRECTION

PATENT NO. : 8,525,352 B2  
APPLICATION NO. : 13/228319  
DATED : September 3, 2013  
INVENTOR(S) : Har et al.

Page 1 of 1

It is certified that error appears in the above-identified patent and that said Letters Patent is hereby corrected as shown below:

<u>In the Claims</u>:

Column 8, Line 36, Claim 1: please delete "first hump" and insert --second hump--.

Column 8, Line 38, Claim 1: please delete "second hump," and insert --first hump--.

Signed and Sealed this
Sixteenth Day of December, 2014

Michelle K. Lee
*Deputy Director of the United States Patent and Trademark Office*